(12) United States Patent
Chen et al.

(10) Patent No.: US 10,516,370 B2
(45) Date of Patent: Dec. 24, 2019

(54) PREDISTORTER FOR COMPENSATING LINEARITY OF AN AMPLIFIER

(71) Applicant: RichWave Technology Corp., Taipei (TW)

(72) Inventors: Chih-Sheng Chen, Taipei (TW); Pei-Chuan Hsieh, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/452,549

(22) Filed: Jun. 26, 2019

(65) Prior Publication Data

US 2019/0319590 A1 Oct. 17, 2019

Related U.S. Application Data

(62) Division of application No. 15/805,125, filed on Nov. 6, 2017, now Pat. No. 10,381,987.

(30) Foreign Application Priority Data

Feb. 15, 2017 (TW) .............................. 106104852 A

(51) Int. Cl.
*H03F 1/32* (2006.01)
*H03F 3/19* (2006.01)
*H03F 1/02* (2006.01)
*H03F 3/21* (2006.01)

(52) U.S. Cl.
CPC ......... *H03F 1/3241* (2013.01); *H03F 1/0205* (2013.01); *H03F 1/0261* (2013.01); *H03F 1/3276* (2013.01); *H03F 3/19* (2013.01); *H03F 3/21* (2013.01); *H03F 2200/18* (2013.01); *H03F 2200/451* (2013.01)

(58) Field of Classification Search
CPC ....................................................... H03F 1/3241
See application file for complete search history.

(56) References Cited

U.S. PATENT DOCUMENTS

| 4,135,201 A | * | 1/1979 | Dickie | ................. H04N 11/186 |
| | | | | 348/713 |
| 5,221,908 A | * | 6/1993 | Katz | ..................... H03F 1/3241 |
| | | | | 330/149 |
| 5,915,213 A | | 6/1999 | Iwatsuki | |
| 6,091,295 A | | 7/2000 | Zhang | |

(Continued)

FOREIGN PATENT DOCUMENTS

TW I479798 B 4/2015
TW I509979 B 11/2015

*Primary Examiner* — Patricia T Nguyen
(74) *Attorney, Agent, or Firm* — Winston Hsu

(57) ABSTRACT

A predistorter has a first capacitor, a first bias input circuit, a second bias input circuit, a second capacitor and an impedance conversion circuit. A first end of the first capacitor is coupled to a first node of the amplifier. The impedance conversion circuit has a first resistor and a field-effect transistor (FET) and is used to perform an impedance conversion to provide a variable capacitance. A gate of the FET is coupled to an output end of the first bias input circuit, one of a source and a drain of the FET is coupled to a second end of the first capacitor and a first end of the first resistor, and another of the source and the drain of the FET is coupled to an output end of the second bias input circuit, first end of the second capacitor and a second end of the first resistor.

10 Claims, 27 Drawing Sheets

(56) References Cited

U.S. PATENT DOCUMENTS

| | | | |
|---|---|---|---|
| 6,262,631 | B1 | 7/2001 | Li |
| 6,369,656 | B2 | 4/2002 | Dening |
| 6,806,774 | B2 | 10/2004 | Sakuno |
| 6,933,780 | B2 | 8/2005 | Fujiwara |
| 7,202,736 | B1 | 4/2007 | Dow |
| 7,321,265 | B2 | 1/2008 | Oka |
| 7,358,817 | B2 | 4/2008 | Kao |
| 7,839,216 | B2 | 11/2010 | Alidio |
| 9,024,700 | B2 * | 5/2015 | Ranta .................. H03K 17/102 333/17.3 |
| 9,748,905 | B2 * | 8/2017 | Scott ....................... H03H 7/09 |
| 2009/0146740 | A1 | 6/2009 | Lau |
| 2013/0002358 | A1 * | 1/2013 | Mitchell ................ G01D 3/036 330/289 |
| 2015/0145604 | A1 | 5/2015 | Scott |
| 2015/0188500 | A1 | 7/2015 | Kang |
| 2015/0214908 | A1 | 7/2015 | Kim |
| 2016/0308498 | A1 * | 10/2016 | Helms .................... H03F 3/193 |

* cited by examiner

PREDISTORTER FOR COMPENSATING LINEARITY OF AN AMPLIFIER

CROSS REFERENCE TO RELATED APPLICATION

This patent application is a divisional application of and claims priority to U.S. patent application Ser. No. 15/805,125, filed on Nov. 6, 2017, and entitled "Predistorter for compensating linearity of an amplifier". Patent application Ser. No. 15/805,125 claims the priority of Taiwan application No. 106104852 Feb. 15, 2017. The entire contents of which are incorporated herein by reference.

TECHNICAL FIELD

The present invention is related to a predistorter, and more particularly to a predistorter for compensating linearity of an amplifier.

BACKGROUND

In all kinds of communications systems, linearity is a basic and important specification for both transmitters and receivers of the communications systems. For the transmitters, amplifiers are important and necessary components. The communication distance, communication quality and standby time, etc. of the transmitters are heavily associated with the amplifiers.

Please refer to FIGS. 1 and 2. FIG. 1 is a schematic diagram of an amplifier 100. FIG. 2 is a diagram representing the amplitude distortion (i.e., AM-AM distortion) and phase distortion (i.e., AM-PM distortion) of the amplifier 100. The amplifier 100 is used to amplify the input signal Sin to generate an output signal Sout. The amplifier 100 comprises a resistor Ra and a bipolar junction transistor (BJT) T1. The emitter of the BJT T1 is coupled to a ground terminal GND. In FIG. 2, a curve 101 is used to represent the phase distortion of the amplifier 100, and another curve 102 is used to represent the amplitude distortion of the amplifier 100. The horizontal axis of the diagram shown in FIG. 2 represents the output power Pout of the amplifier 100, and the vertical axis represents the amplitude distortion and phase distortion of the amplifier 100. The unit of the amplitude distortion is "dB", and the unit of the phase distortion is "degree". As shown in FIG. 2, the curve 101 is a curve with an upward notch and the curve 102 is a curve with a downward notch so that the phase distortion of the amplifier 100 increases as the output power Pout increases and that the amplitude distortion of the amplifier 100 decreases as the output power Pout increases. However, since the notches of the curves 101 and 102 are curved toward different directions, it is difficult to compensate the linearity of the amplifier 100.

SUMMARY

According to an embodiment of the present invention, a predistorter is used to compensate linearity of an amplifier. The predistorter comprises a first capacitor, a first bias input circuit and an impedance conversion circuit. The first capacitor has a first end coupled to a first node of the amplifier. The first bias input circuit is configured to receive a first bias. The impedance conversion circuit is configured to perform an impedance conversion to provide a variable capacitance. The impedance conversion circuit comprises a bipolar junction transistor (BJT). The BJT has a base coupled to an output end of the first bias input circuit and a second end of the first capacitor, a floating collector, and an emitter coupled to a second node of the amplifier.

According to another embodiment of the present invention, a predistorter comprises a first capacitor, a first bias input circuit, a second bias input circuit, a second capacitor and an impedance conversion circuit. The predistorter is used to compensate linearity of an amplifier. The first capacitor has a first end coupled to a first node of the amplifier. The first bias input circuit is configured to receive a first bias, and the second bias input circuit is configured to receive a second bias. The impedance conversion circuit is configured to perform an impedance conversion to provide a variable capacitance. The impedance conversion circuit comprises a first resistor and a field-effect transistor (FET). A gate of the FET is coupled to an output end of the first bias input circuit, one of a source and a drain of the FET is coupled to a second end of the first capacitor and a first end of the first resistor, another of the source and the drain of the FET is coupled to an output end of the second bias input circuit, a first end of the second capacitor and a second end of the first resistor, and a second end of the second capacitor is coupled to a second node of the amplifier.

According to another embodiment of the present invention, a predistorter is used to compensate linearity of an amplifier. The predistorter comprises a first capacitor and an impedance conversion circuit. A first end of the first capacitor is coupled to a first node of the amplifier. The impedance conversion circuit is configured to perform an impedance conversion to provide a variable capacitance. The impedance conversion circuit comprises a first bias input circuit and a diode. The first bias input circuit is configured to receive a first bias. An anode of the diode is coupled to an output end of the first bias input circuit and a second end of the first capacitor, and a cathode of the diode is coupled to a second node of the amplifier.

DETAILED DESCRIPTION

Figure 1:
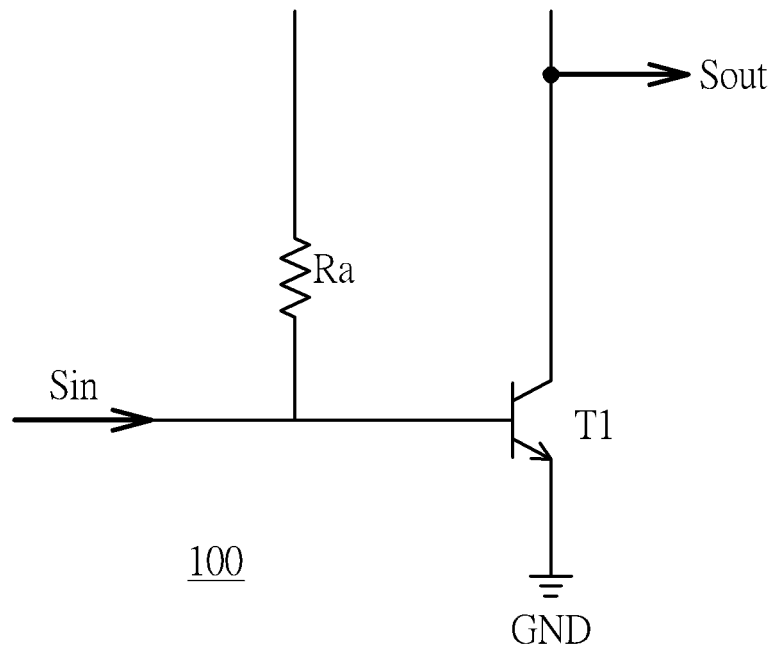
FIG. 1 is a schematic diagram of an amplifier.
Figure 2:
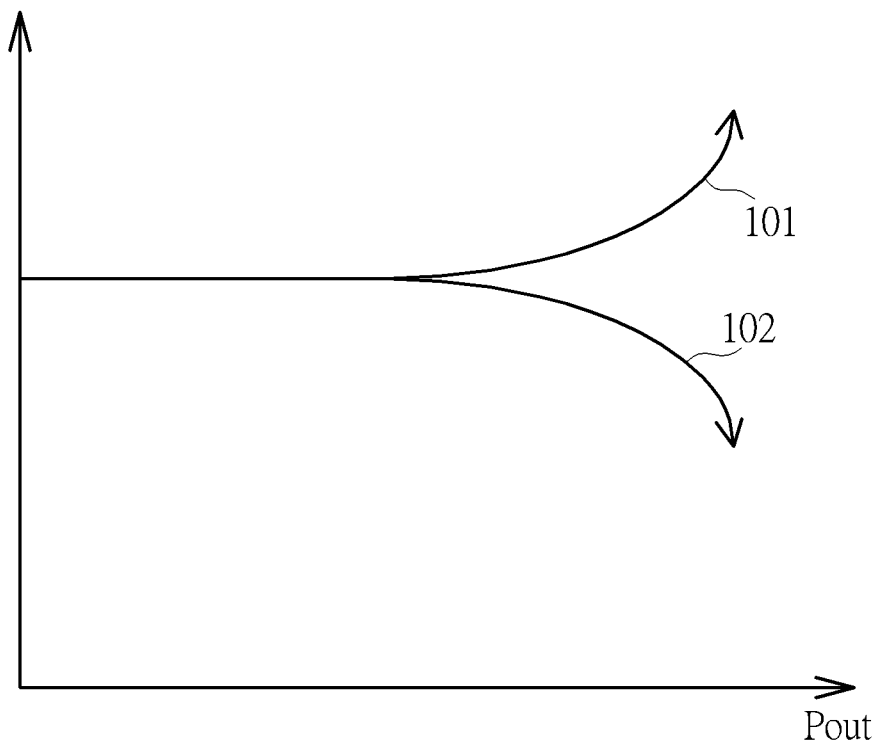
FIG. 2 is a diagram showing the amplitude distortion and phase distortion of the amplifier in FIG. 1.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 3:
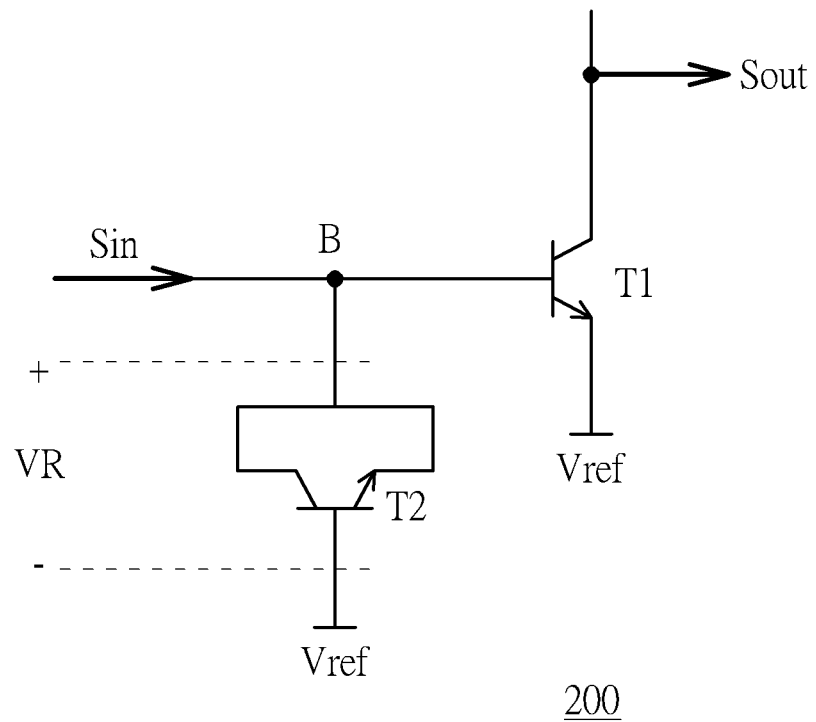
FIG. 3 is a schematic diagram of an amplifier according to an embodiment of the present invention.
Figure 4:
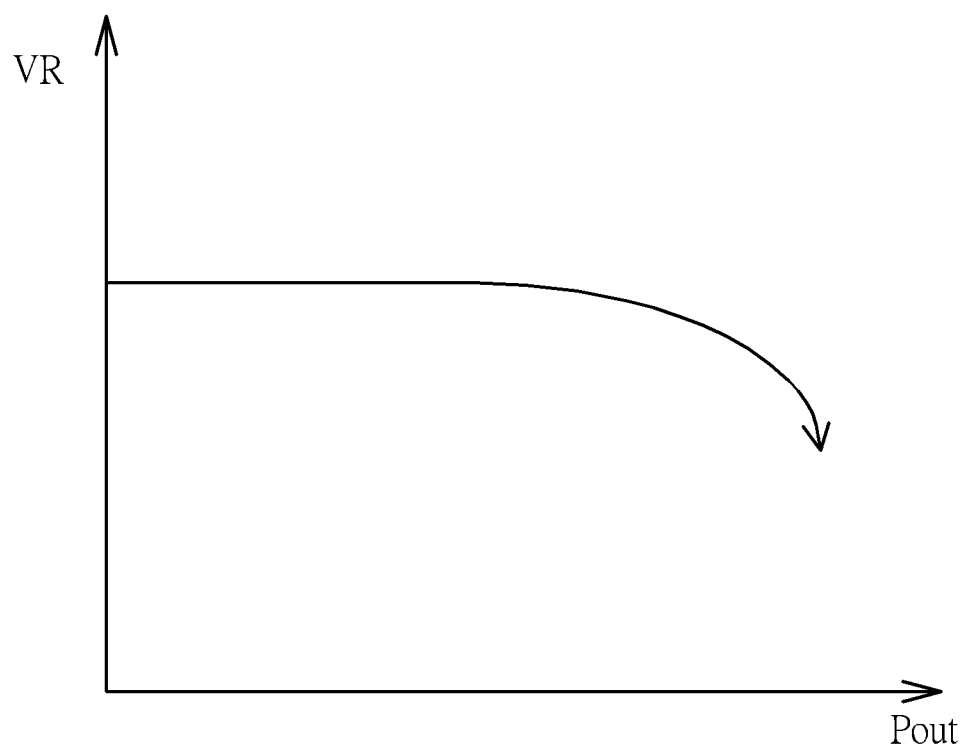
FIG. 4 is a diagram showing the relationship between an output power of the amplifier and a bias of a collector of a bipolar junction transistor shown in FIG. 3.

Please refer to FIG. 3. FIG. 3 is a schematic diagram of an amplifier 200 according to an embodiment of the present invention. The amplifier 200 may be a power amplifier, but the present invention is not limited thereto. The amplifier 200 may be a power amplifier, but the present invention is not limited thereto. The amplifier 200 comprises two bipolar junction transistors (BJTs) T1 and T2, and the collector and the emitter of the BJT T2 are coupled to each other so that the amplitude distortion (i.e. AM-AM distortion) and phase distortion (i.e. AM-PM distortion) of the amplifier 200 may be increased or decreased simultaneously with an output power of the amplifier 200. Please refer to FIGS. 3 and 4. FIG. 4 is a diagram showing the relationship between the output power Pout of the amplifier 200 and the bias voltage VR of the collector of the BJT T2. The bias voltage VR decreases as the output power Pout increases. However, when the BJT T2 is a heterojunction bipolar transistor (HBT) made of gallium arsenide (GaAs), the depletion capacitance of the BJT T2 is inversely proportional to the square root of the bias voltage VR. Therefore, the depletion capacitance of the BJT T2 is less sensitive to the bias voltage VR and causes the impedance of the node B to be low. Accordingly, the BJT T2 needs to have a sufficiently large volume so that its depletion capacitance would not be too narrow. However, increasing the volume of the BJT T2 may result in a lower gain of the amplifier 200 and a narrower bandwidth.

Figure 5:
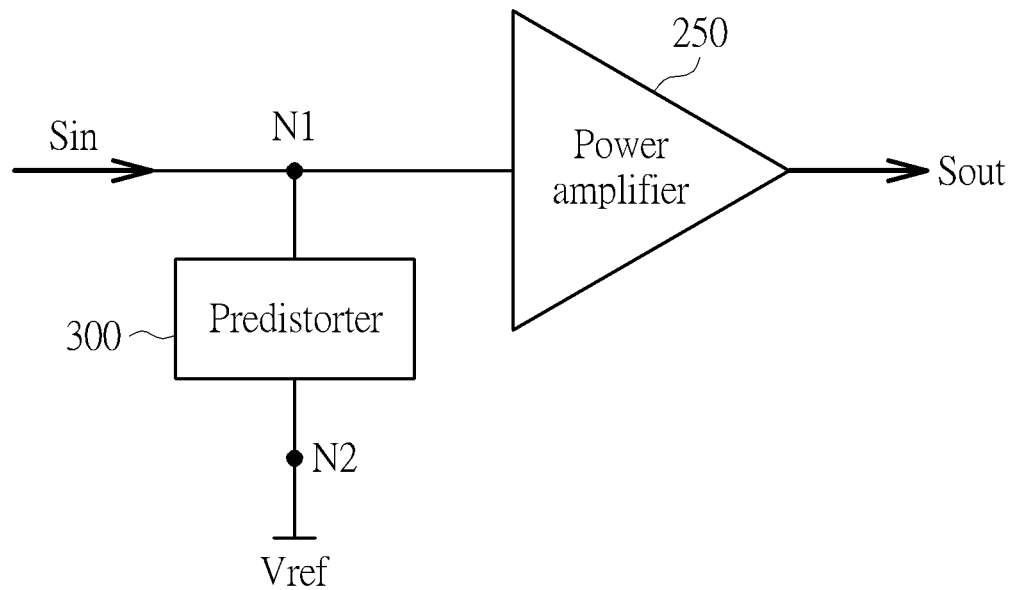
FIG. 5 is a schematic diagram of a predistorter for compensating the linearity of an amplifier according to an embodiment of the present invention.

Please refer to FIG. 5. FIG. 5 is a schematic diagram of a predistorter 300 for improving the linearity of the amplifier 250 according to an embodiment of the present invention. The amplifier 250 may be a power amplifier, but the present invention is not limited thereto. The amplifier 250 may be, for example, a low noise amplifier. In the present embodiment, the predistorter 300 and the amplifier 250 in FIG. 5 are different devices for the sake of convenience of explanation. It should be understood that the predistorter 300 may also be integrated into the amplifier 250 and become a part of the amplifier 250. As shown in FIG. 5, the predistorter 300 is coupled between the node N1 and the node N2. The node N1 is an input end of the amplifier 250, and the node N2 is coupled to a reference voltage Vref. In an embodiment of the present invention, the reference voltage Vref maybe a ground voltage, but the present invention is not limited thereto. The amplifier 250 amplifies the inputted input signal Sin to generate an output signal Sout. The predistorter 300 is used to compensate the linearity of the amplifier 250. The compensation of the linearity of the predistorter 300 to the amplifier 250 includes compensation for the amplitude distortion (i.e., AM-AM Distortion) and the phase distortion (i.e., AM-PM Distortion) of the amplifier. Due to the predistorter 300, the amplitude distortion and phase distortion of the amplifier 250 would be increased simultaneously or decreased simultaneously with the output power of the amplifier 250. In addition, the predistorter 300 may provide a variable capacitance to adjust the linearity of the amplifier 250. Due to the variable capacitance provided by the predistorter 300, problems of the amplifier 200 shown in FIG. 3, e.g., having a large volume, a low gain and/or a narrow bandwidth, could be reduced or avoided.

Figure 6:
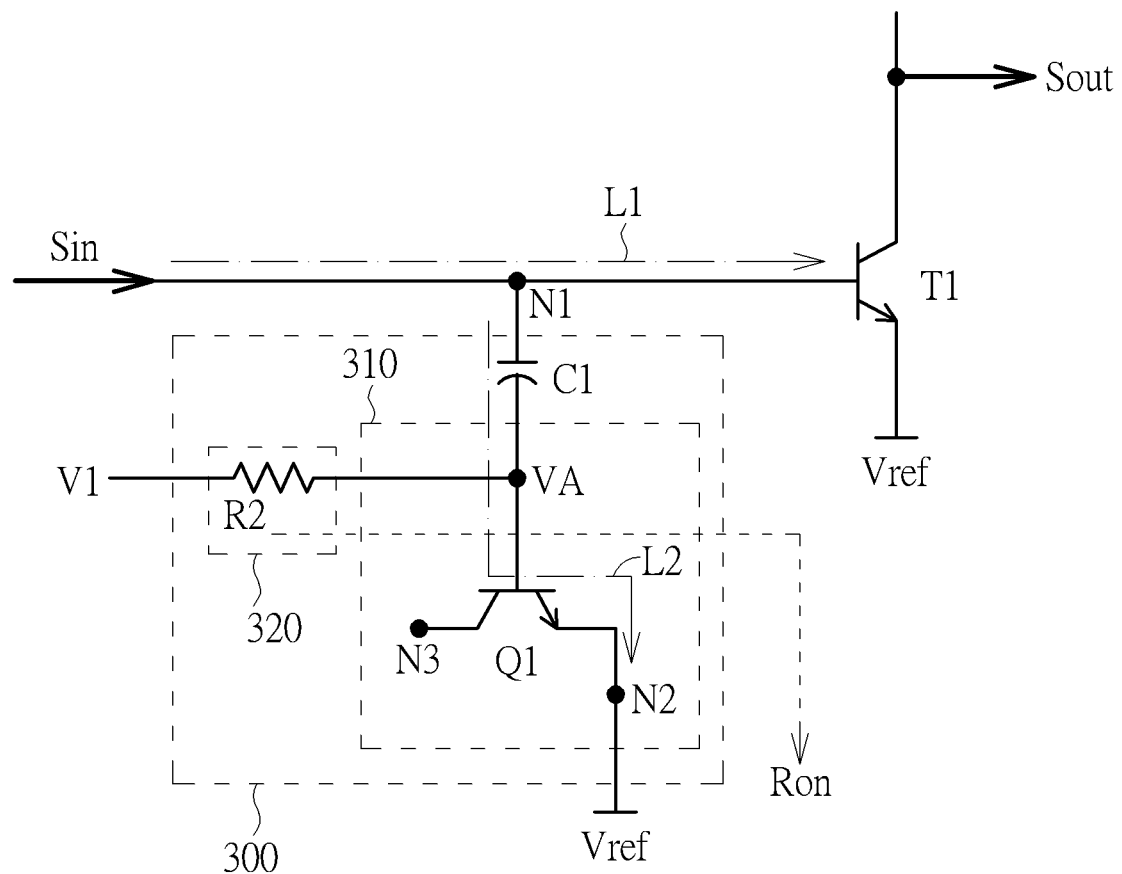
FIG. 6 is a circuit diagram of a predistorter according to an embodiment of the present invention.

Please refer to FIG. 6. FIG. 6 is a circuit diagram of a predistorter 300 according to an embodiment of the present invention. The predistorter 300 is coupled between the node N1 and the node N2 and comprises a capacitor C1, an impedance conversion circuit 310 and a bias input circuit 320. The node N1 is coupled to the base of the BJT T1, and the bipolar junction transistor T1 is an element of the amplifier 250. The first end of the capacitor C1 is coupled to the first node N1 of the amplifier. The input signal Sin is inputted to the amplifier 250 via a signal amplification path L1 and is amplified by the amplifier 250 as an output signal Sout. The predistorter 300 forms a signal split path L2 which is different from the signal amplification path L1. Since the signal shunt path L2 of the predistorter 300 is different from the signal amplification path L1, and the predistorter 300 isolates the direct-current (DC) signal by the capacitor C1 to reduce the influence on the signal amplification path L1, the predistorter 300 may compensate the linearity of the amplifier 250 in the case where the original design of the amplifier 250 is not changed substantially. In addition, the impedance conversion circuit 310 is used to perform an impedance conversion to provide the variable capacitance to the amplifier 250 so as to adjust the linearity of the amplifier 250. The bias input circuit 320 is used to receive the bias V1. The impedance conversion circuit 310 comprises a bipolar junction transistor (BJT) Q1. The BJT Q1 and the capacitor C1 are provided on the signal split path L2. The base of the BJT Q1 is coupled to the output end of the bias input circuit 320 and the second end of the capacitor C1. The collector of the BJT Q1 is floating, the emitter of the BJT Q1 is coupled to the node N2, and the node N2 is coupled to the reference voltage Vref.

Figure 7:
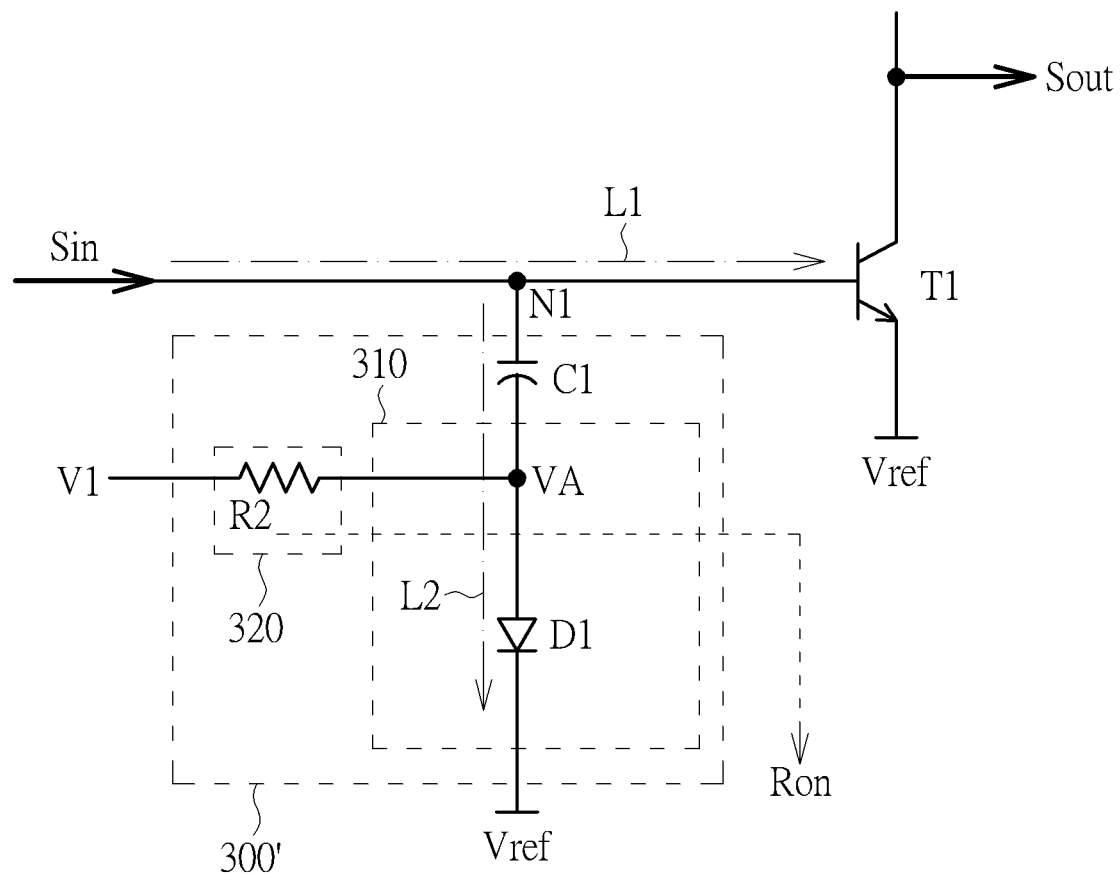
FIG. 7 is a circuit diagram of a predistorter according to another embodiment of the present invention.

In another embodiment of the present invention, the BJT Q1 may be replaced by a diode. Please refer to FIG. 7. FIG. 7 is a circuit diagram of a predistorter 300' according to another embodiment of the present invention. The difference between the predistorters 300'and 300 is that the transistor Q1 of the predistorter 300 is replaced by the diode D1. The anode of the diode D1 is substantially equivalent to the base of the transistor Q1, and the cathode of the diode is substantially equivalent to the emitter of the transistor Q1. The diode D1 and the capacitor C1 are provided on the signal split path L2. Compared with the transistor Q1, the diode D1 may occupy a larger layout area.

Figure 8:
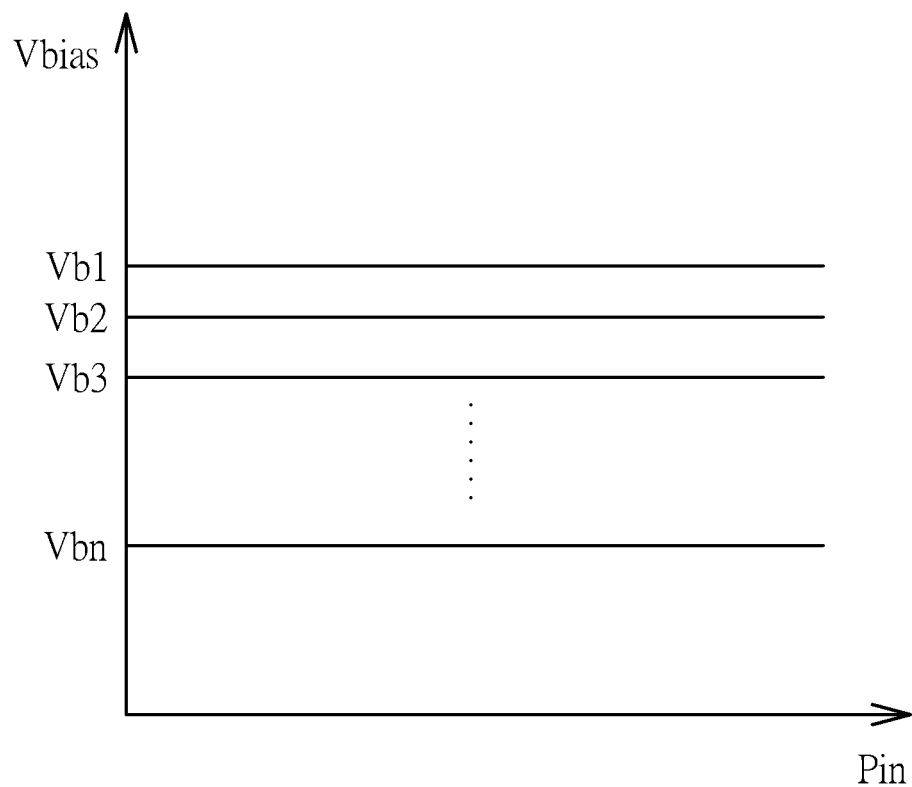
FIG. 8 shows the relationship between an input power of the amplifier and the constant voltage Vbias.

In an embodiment of the present invention, the bias V1 in FIGS. 6 and 7 is a constant voltage Vbias whose voltage level does not change with the input signal Sin or the input power of the amplifier 250. In an embodiment of the present invention, the constant voltage Vbias may be selected from a plurality of fixed voltage levels. Please refer to FIG. 8. FIG. 8 is a diagram showing the relationship between the input power Pin of the amplifier 250 and the constant voltage Vbias. The constant voltage Vbias is selected from the fixed voltages Vb1 to Vbn. As shown in FIG. 7, the voltage levels of the voltages Vb1 to Vbn do not change with the input power Pin of the amplifier 250. The degree of adjusting the linearity of the amplifier 250 may be affected by the magnitude of the constant voltage Vbias (i.e., the bias V1). Therefore, by selecting an appropriate voltage from the voltages Vb1 to Vbn as the constant voltage Vbias, the linearity of the amplifier 250 can be finely adjusted to meet different design demands of different amplifiers.

Figure 9:
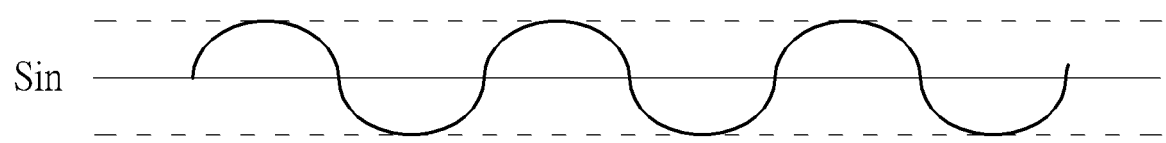
FIG. 9 is a waveform diagram of an input signal Sin shown in FIG. 6.
Figure 10:
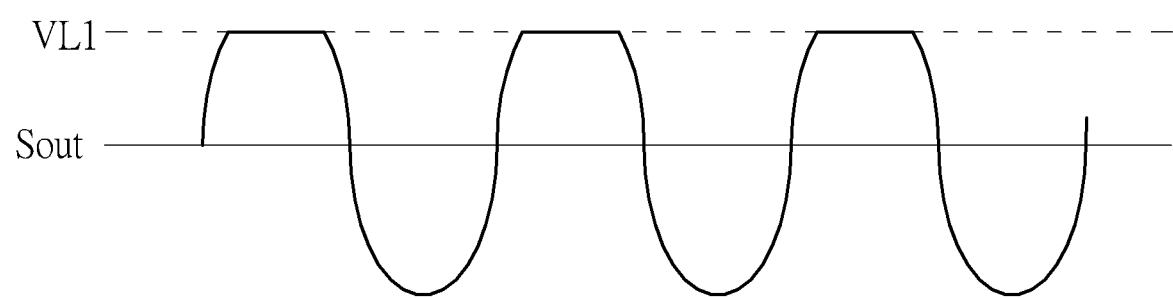
FIG. 10 is a waveform diagram of an output signal Sout shown in FIG. 6.
Figure 11:
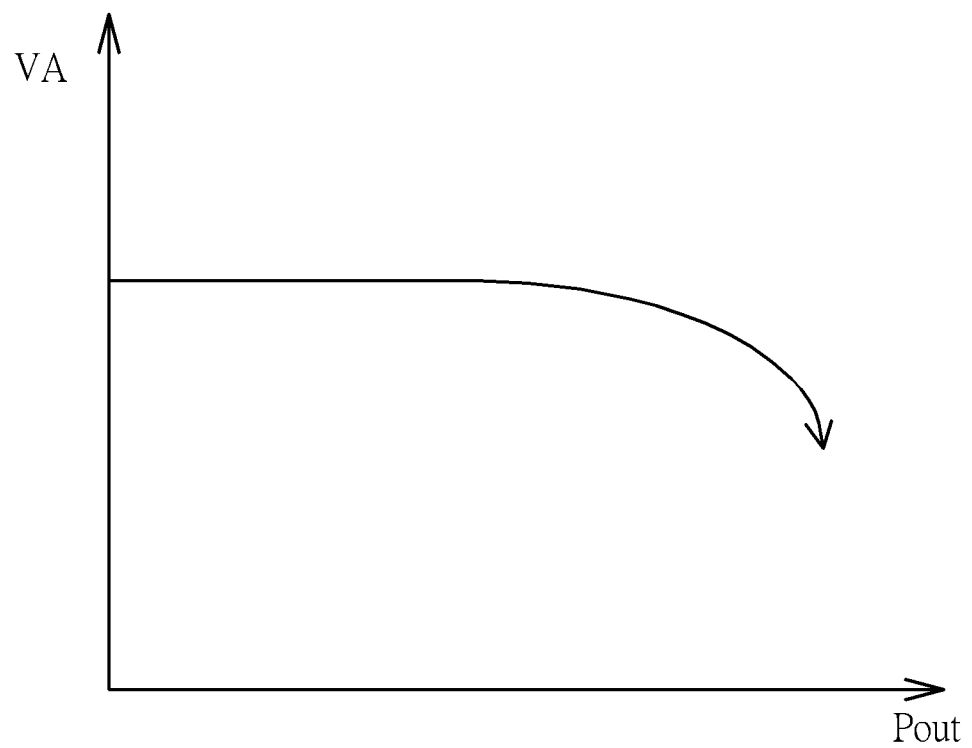
FIG. 11 is a diagram showing the relationship between a voltage VA and an output power of the amplifier shown in FIG. 6.
Figure 12:
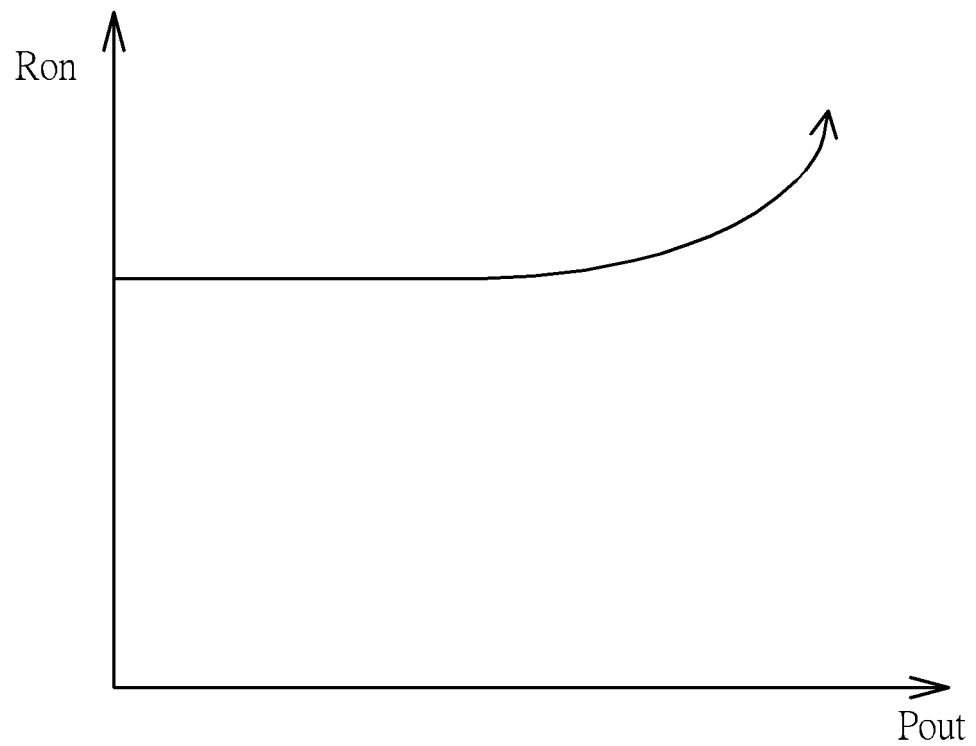
FIG. 12 shows the relationship between the impedance Ron of an impedance conversion circuit and the output power of the amplifier.

Please refer to FIG. 6. In the present embodiment, the bias V1 is a positive voltage having a fixed voltage level. Since the collector of the BJT Q1 is floating, the BJT Q1 can be regarded as a forward biased diode having a clipping function. Please refer to FIGS. 9 and 10. FIG. 9 is a waveform diagram of the input signal Sin, and FIG. 10 is a waveform diagram of the output signal Sout. For the sake of the convenience of explanation, the input signal Sin is represented by a sine wave, but it should be understood that the present invention is not limited thereto, and the input signal Sin may be a radio frequency (RF) signal having a different waveform. Since the BJT Q1 has the clipping function, the peak of the output signal Sout does not exceed an upper limit VL1. Therefore, when the input signal Sin is a sine wave, the output signal Sout may not be a sine wave. Since the BJT Q1 has the clipping function, the impedance Ron of the impedance conversion circuit 310 would be affected. Due to the impedance conversion, the variable capacitance provided by the impedance conversion circuit 310 is related to the impedance Ron. Please refer to FIGS. 11 and 12. FIG. 11 is a diagram showing the relationship between the voltage VA and the output power Pout of the amplifier 250 in FIG. 6. FIG. 12 shows the relationship between the impedance Ron of the impedance conversion circuit 310 and the output power Pout of the amplifier 250. When the output power Pout of the amplifier 250 increases, the voltage VA decreases and the impedance Ron increases. Since the predistorter 300 has the foresaid characteristics, the predistorter 300 is suitable for solving the problems of AM-AM distortion and for improving the linearity of the amplifier.

Please refer to FIG. 6 again. In another embodiment of the present invention, the bias input circuit 320 may comprise a resistor R2. A first end of the resistor R2 is used to input the bias V1 and a second end of the resistor R2 is coupled to the output end of the bias input circuit 320. The resistor R2 has a fixed resistance, and the resistance of the resistor R2 can be determined based on different design demands of the amplifiers. When the resistor R2 with a large resistance is selected, the impedance Ron is also relatively large. When the resistor R2 with a less resistance is selected, the impedance Ron is relatively smaller.

In some embodiments of the present invention, the BJT Q1 may be a heterojunction bipolar transistor (HBT). In other embodiments of the present invention, the BJT Q1 may be a homogeneous bipolar transistor.

Figure 13:
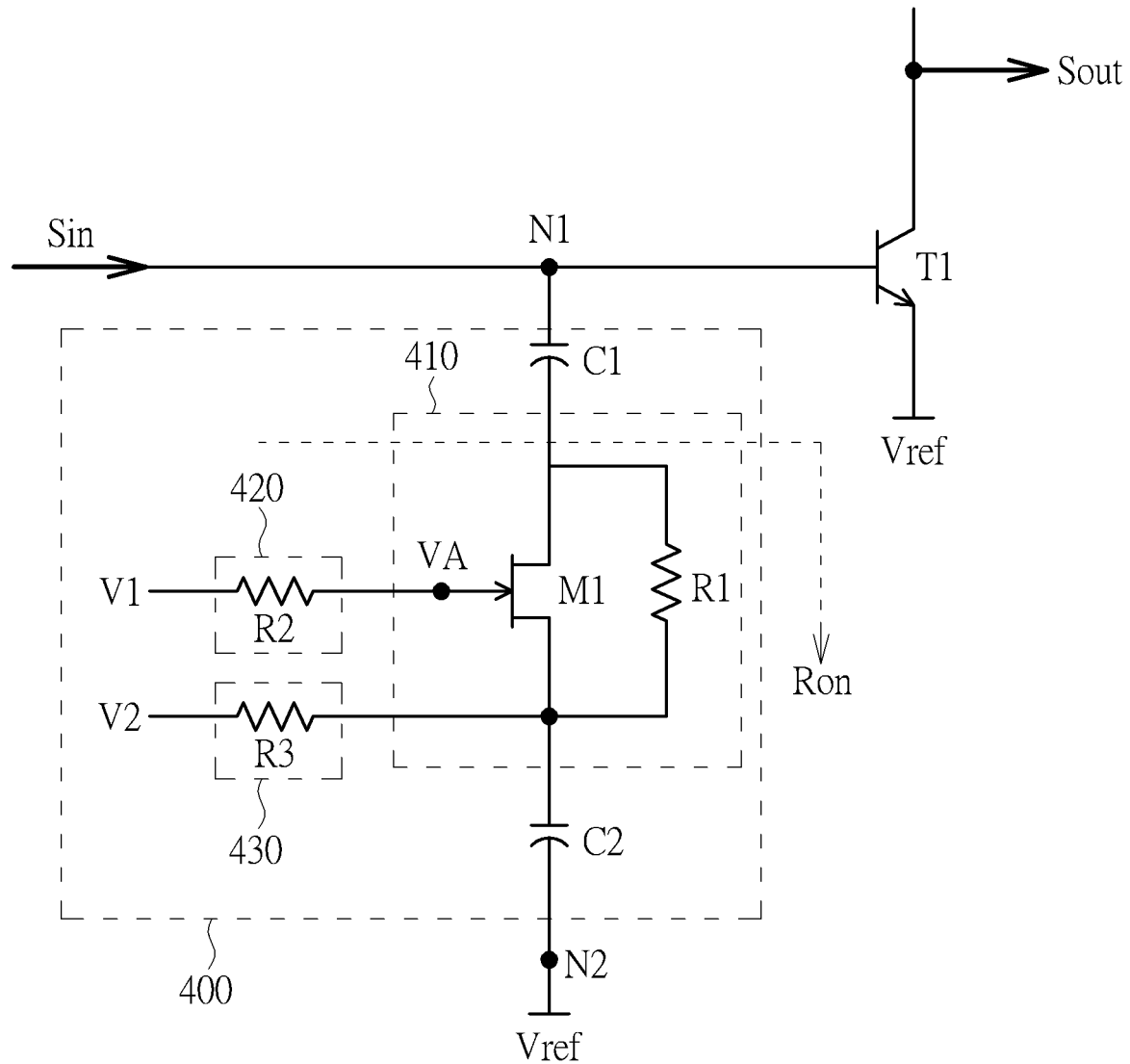
FIG. 13 is a circuit diagram of a predistorter according to an embodiment of the present invention.

Please refer to FIG. 13. FIG. 13 is a circuit diagram of a predistorter 400 according to an embodiment of the present invention. The predistorter 400 is also coupled between the node N1 and the node N2, and comprises a capacitor C1, a capacitor C2, an impedance conversion circuit 410, a bias input circuit 420 and a bias input circuit 430. The first end of the capacitor C1 is coupled to the node N1. The bias input circuit 420 is used to input the bias V1, and the bias input circuit 430 is used to input the bias V2. The impedance conversion circuit 410 is used to perform an impedance conversion so as to provide a variable capacitance. The impedance conversion circuit 410 comprises a resistor R1 and a field effect transistor (FET) M1. The gate of the FET M1 is coupled to the output end of the bias input circuit 420. One of the source and the drain of the FET M1 is coupled to the second end of the capacitor C1 and the second end of the resistor R1, and another of the source and the drain of the FET M1 is coupled to the output end of the bias input circuit 430, a first end of the capacitor C2 and a second end of the first resistor R1. A second end of the capacitor C2 is coupled to the node N2 of the amplifier, and the node N2 is coupled to the reference voltage Vref.

Figure 14:
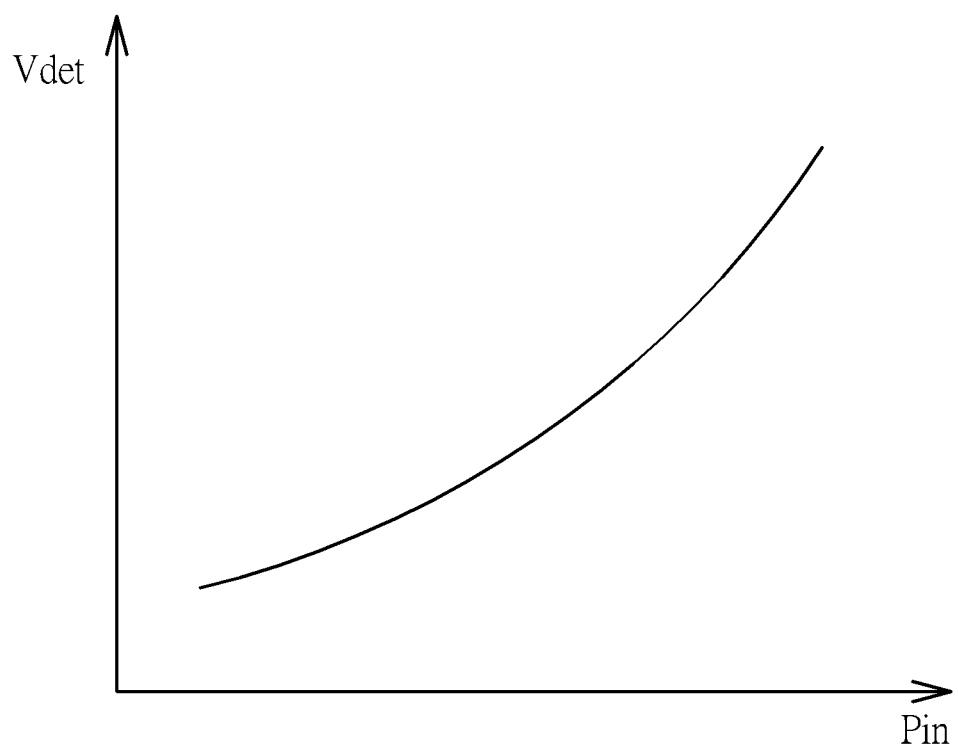
FIG. 14 shows the relationship between the input power of the amplifier and a voltage Vdet.

In the present embodiment, the bias V1 is a constant voltage Vbias whose voltage level does not change with the input signal Sin or the input power of the amplifier, and the bias V2 is the voltage Vdet whose voltage level changes with the input signal Sin or the input power of the amplifier. Please refer to FIG. 14. FIG. 14 shows the relationship between the input power of the amplifier and a voltage Vdet. Greater the input power Pin of the amplifier is, greater the voltage Vdet will be. The impedance conversion circuit 410 may be also regarded as a forward biased diode having the function of truncation. Since the relationship between the voltage VA of the predistorter 400 and the output power Pout of the amplifier could be represented by FIG. 11, and the relationship between the impedance Ron of the predistorter 400 and the output power Pout of the amplifier could be represented by FIG. 12, the descriptions thereof would not be repeated herein. The variable capacitance provide by the impedance conversion circuit 410 is related to the impedance Ron.

Figure 15:
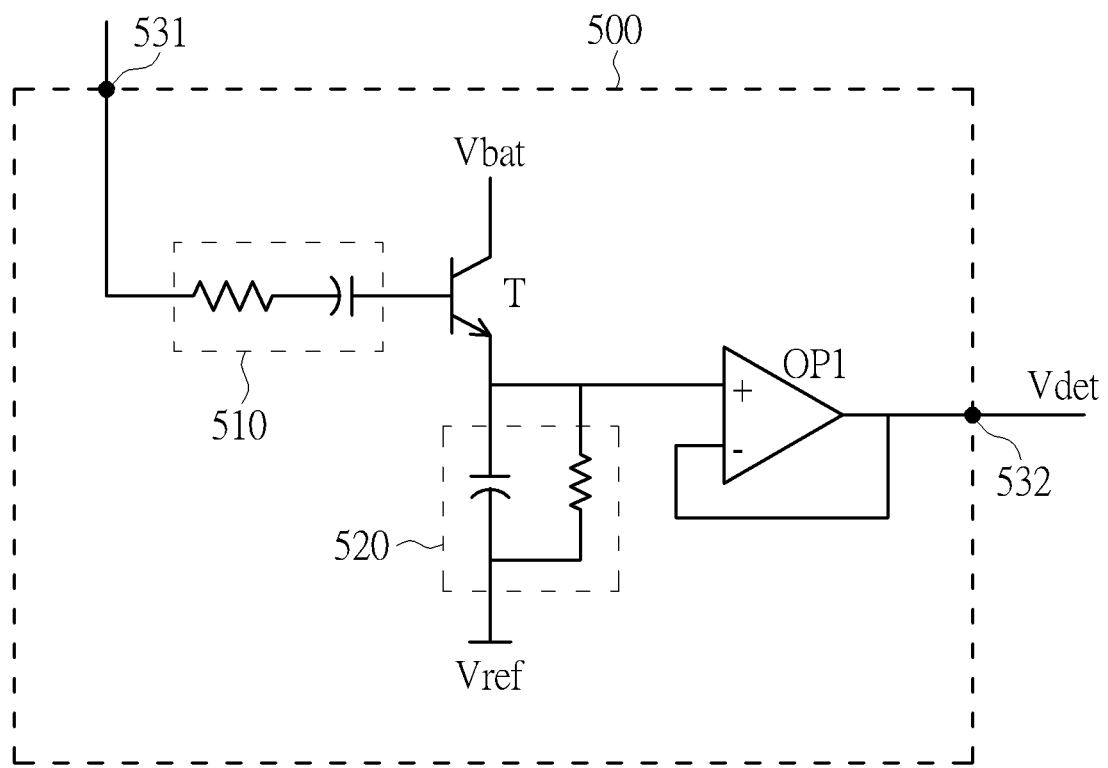
FIG. 15 is a circuit diagram of a dynamic bias adjusting circuit according to an embodiment of the present invention.

The voltage Vdet may be generated by the dynamic bias adjusting circuit 500 of the predistorter 400. Please refer to FIG. 15. FIG. 15 is a circuit diagram of a dynamic bias adjusting circuit 500 according to an embodiment of the present invention. The dynamic bias adjusting circuit 500 is coupled to an input end (e.g., node N1) of the amplifier for dynamically adjusting the magnitude of the voltage Vdet according to the input power of the amplifier. An input end 531 of the dynamic bias adjusting circuit 500 receives the input signal Sin, and an output end 532 of the dynamic bias adjusting circuit 500 outputs the voltage Vdet. The dynamic bias adjusting circuit 500 comprises a resistive capacitance circuit 510, a transistor T, a resistive capacitance circuit 520, and an operational amplifier OP1. An input end of the resistive capacitance circuit 510 is coupled to the input end N1 of the amplifier. The transistor T may be a BJT. The collector (i.e., a first end) of the BJT T is coupled to the system voltage Vbat, the base (i.e., a control end) of the BJT T is coupled to the output end of the resistive capacitor circuit 510, and the emitter (i.e., a second end) of the BJT T is coupled to the input end of the resistive capacitor circuit 520. The system voltage Vbat is, for example, the output voltage of the battery, and the system voltage Vbat is usually higher than the reference voltage Vref. The resistive capacitance circuit 520 is coupled between the reference voltage Vref and the emitter of the BJT T. A positive input end of the operational amplifier OP1 is coupled to the emitter of the BJT T, a negative input end of the operational amplifier OP1 is coupled to an output end of the operational amplifier OP1, and the output end of the operational amplifier OP1 outputs the voltage Vdet.

Please refer to FIG. 13 again. In an embodiment of the present invention, the bias input circuit 420 comprises a resistor R2, and the bias input circuit 430 comprises a resistor R3. The first end of the resistor R2 receives the bias V1, and the second end of the resistor R2 is coupled to the output end of the bias input circuit 420. The first end of the resistor R3 receives the bias V2, and the second end of the resistor R3 is coupled to the output end of the bias input circuit 430.

Figure 16:
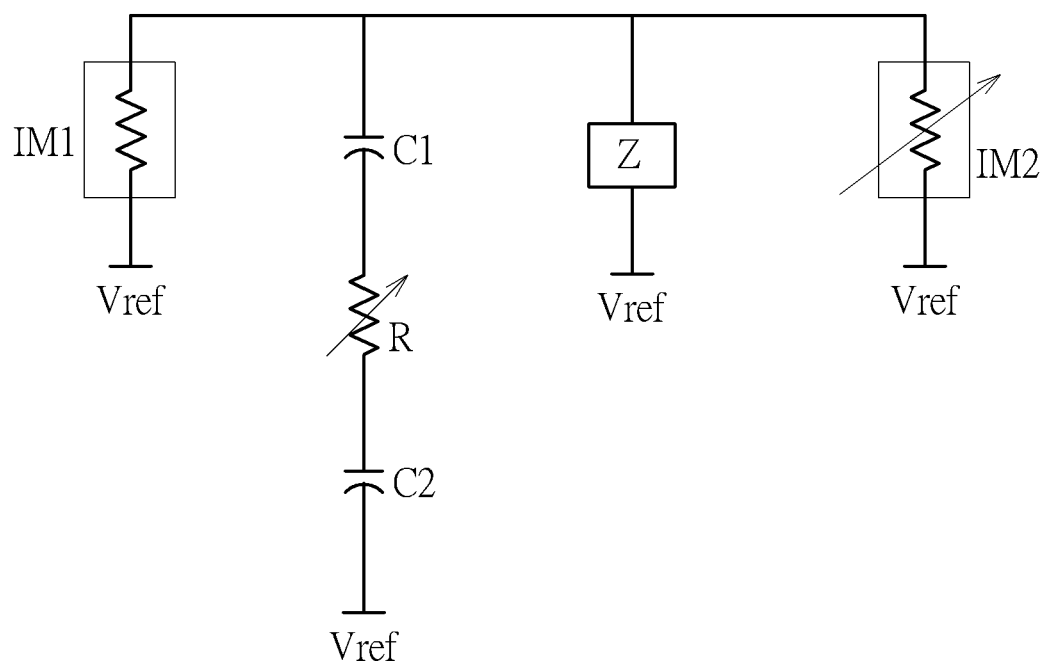
FIG. 16 is an equivalent circuit diagram of the predistorter shown in FIG. 6, FIG. 7, or FIG. 13.

Please refer to FIG. 16. FIG. 16 is an equivalent circuit diagram of the predistorter 300, 300' or 400 shown in FIG. 6, FIG. 7, or FIG. 13. Taking the predistorter 400 in FIG. 13 for example, the predistorter 400 may be regarded in parallel with the input stage circuit and the output stage circuit of the amplifier. The input stage circuit of the amplifier has an impedance IM1, and the output stage circuit of the amplifier has an impedance IM2. The predistorter 400 comprises a capacitor C1 and the impedance conversion circuit 410. The impedance conversion circuit 410 is used to perform an impedance conversion so as to provide a variable resistor R. An impedance Z is the interstage matching impedance and could be represented by inductance or capacitance. A capacitor C2 exists between the source of the FET M1 and the reference voltage Vref. Equivalent circuit diagrams of the predistorters 300 and 300' in FIGS. 6 and 7 are similar to the diagram illustrated in FIG. 16. In detail, after removing the capacitor C2 in FIG. 16, one end of the variable resistor R is directly coupled to the reference voltage Vref, that is, the equivalent circuit diagram of the predistorters 300 and 300'.

Figure 17:
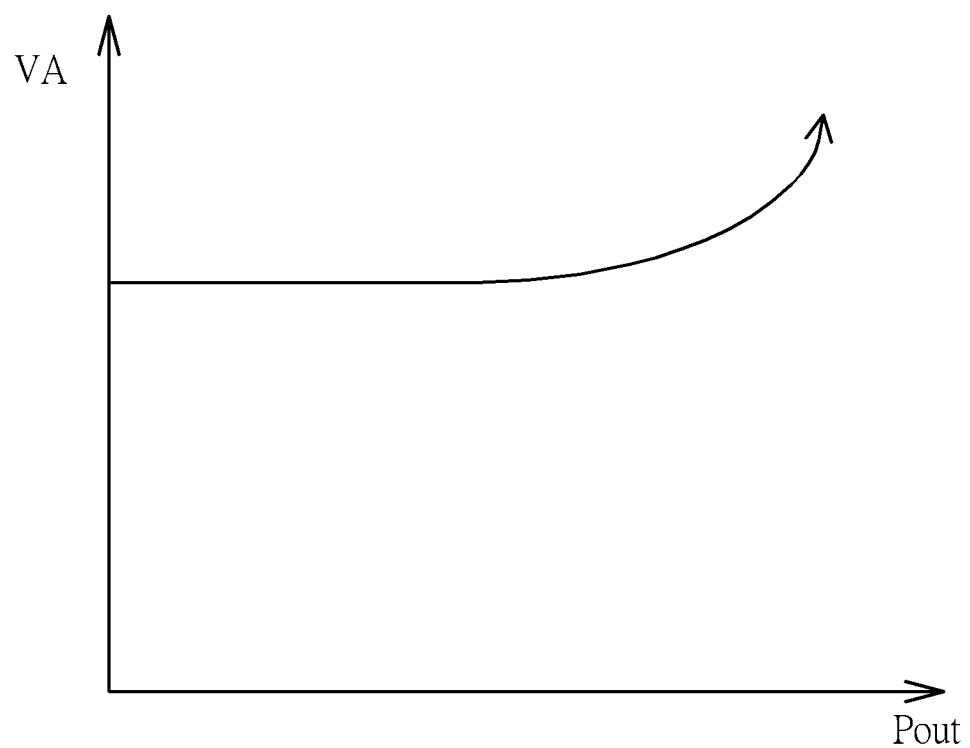
FIG. 17 is a diagram showing the relationship between the voltage VA and the output power of the amplifier in FIG. 6 when the bias V1 is the voltage Vdet.
Figure 18:
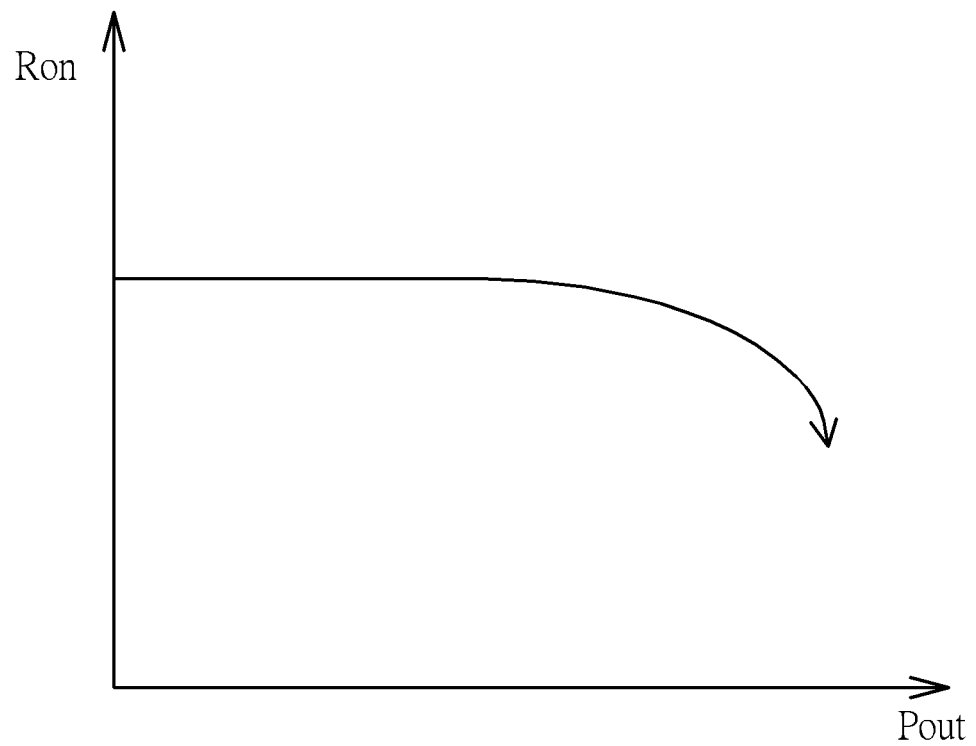
FIG. 18 is a diagram showing the relationship between the impedance Ron and the output power of the amplifier in FIG. 6 when the bias V1 is the voltage Vdet.

Compared with the impedance Ron which increases with the output power Pout, the impedance Ron of the predistorter according to another embodiment of the present invention may decrease as the output power Pout increases. Please refer to FIG. 6 again. When the bias V1 in FIG. 6 is changed to be the voltage Vdet whose voltage level varies with the input signal Sin or the input power of the amplifier, the impedance Ron decreases while the output power Pout increases. Please refer to FIGS. 17 and 18. FIG. 17 is a diagram showing the relationship between the voltage VA and the output power of the amplifier in FIG. 6 when the bias V1 is the voltage Vdet. FIG. 18 is a diagram showing the relationship between the impedance Ron and the output power of the amplifier in FIG. 6 when the bias V1 is the voltage Vdet. When the output power Pout of the amplifier 250 increases, the voltage VA increases, and the impedance Ron decreases. Therefore, the impedance characteristic of the predistorter 300 can be changed by setting the bias V1 to the constant voltage Vbias or to the voltage Vdet to adjust and compensate the linearity of the amplifier in different directions.

Similarly, when the bias V1 of the predistorter 400 in FIG. 13 is the voltage Vdet and the bias V2 is the constant voltage Vbias, the voltage VA of the predistorter 400 increases when the output power Pout of the amplifier 250 increases, and the impedance Ron of the predistorter 400 decreases when the output power Pout of the amplifier 250 increases. The impedance characteristic of the predistorter 400 can be changed by setting the bias V1 to one of the constant voltage Vbias and the voltage Vdet and by setting the bias V2 to another of the constant voltage Vbias and the voltage Vdet, such that the linearity of the amplifier could be adjusted and compensated in different directions. Since the predistorter 400 has the foresaid characteristics, when the bias V1 is the constant voltage Vbias and the bias V2 is the voltage Vdet (or when the bias V1 is the voltage Vdet and the bias V2 is the constant voltage Vbias), the compensator 400 is suitable for solving the problems of AM-AM distortion and for improving the linearity of the amplifier.

Figure 19:
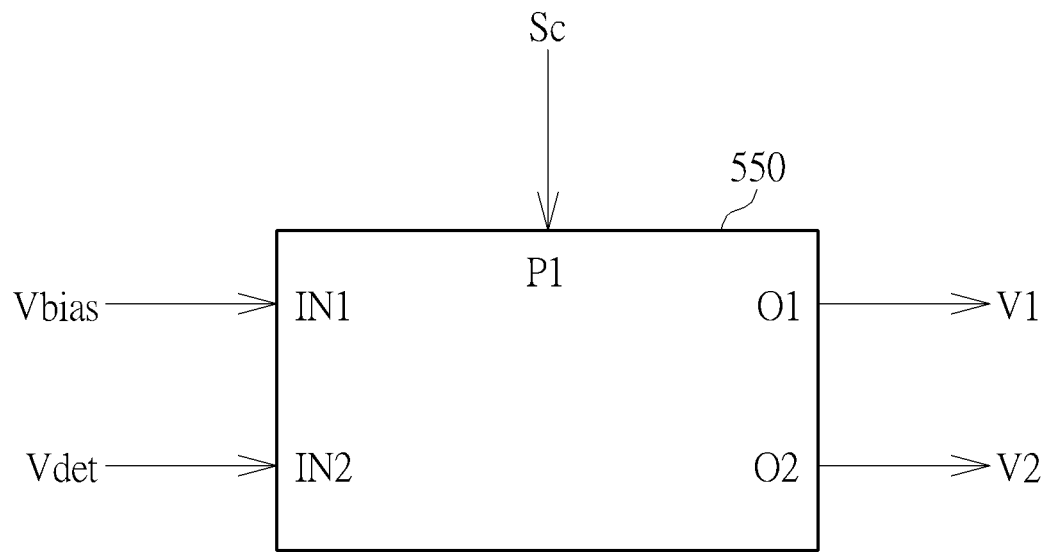
FIG. 19 is a schematic diagram of a selection circuit according to an embodiment of the present invention.
Figure 20:
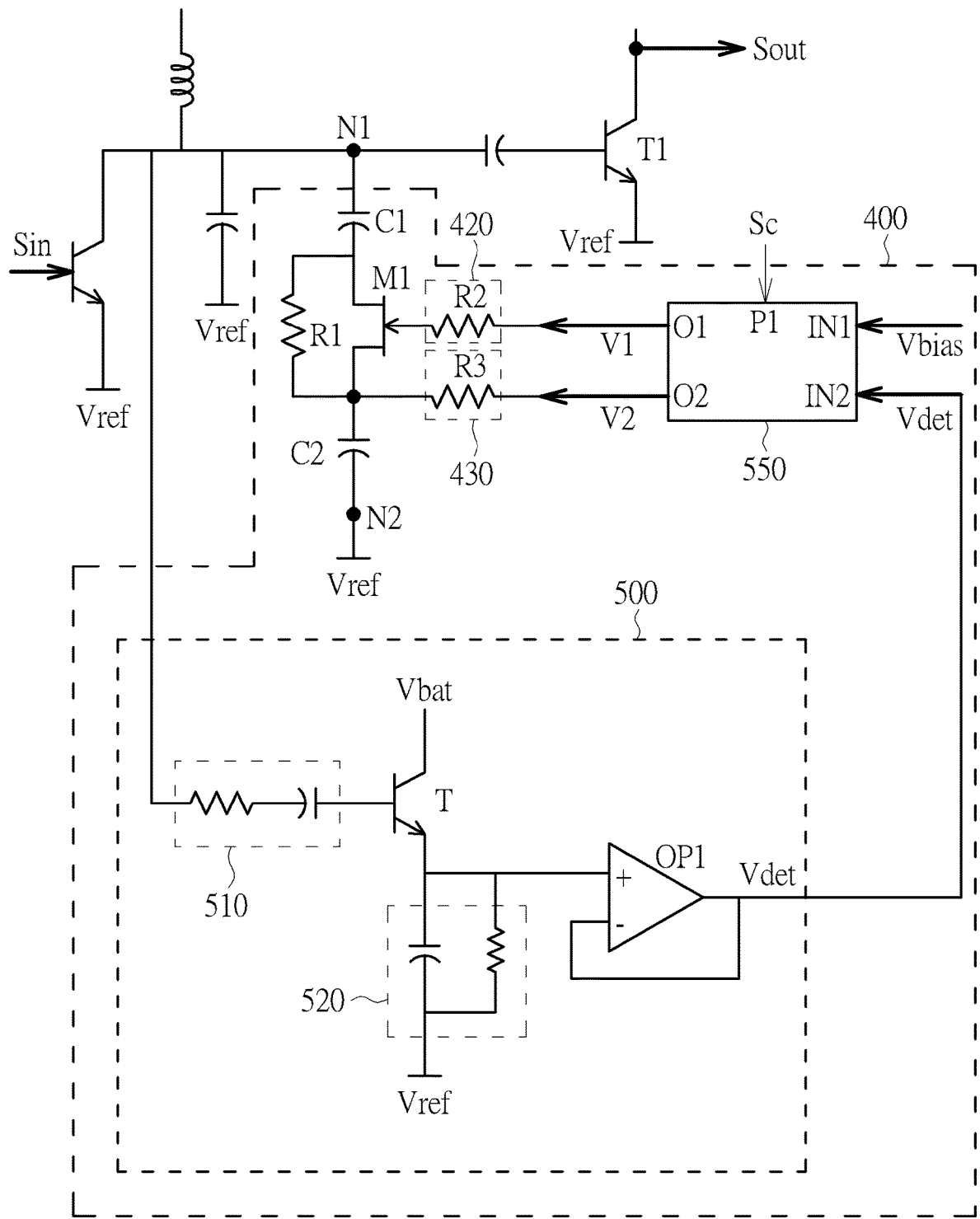
FIG. 20 is a schematic diagram showing the predistorter in FIG. 13 further comprising the dynamic bias adjusting circuit and the selection circuit.

In order to facilitate switching the constant voltage Vbias and the voltage Vdet, the aforementioned predistorter 300 or 400 may further comprise a selection circuit 550. Please refer to FIGS. 19 and 20. FIG. 19 is a schematic diagram of a selection circuit 550 according to an embodiment of the present invention. FIG. 20 is a schematic diagram showing the predistorter 400 in FIG. 13 further comprising the dynamic bias adjusting circuit 500 and the selection circuit 550. The selection circuit 550 comprises a first input end IN1, a second input end IN2, a first output end O1, a second output end O2, and a control end P1. The first input end IN1 receives the constant voltage Vbias. The second input end IN2 receives the voltage Vdet. The first output end O1 is coupled to the input end of the bias input circuit 420 to provide the bias V1. The second output end O2 is coupled to the input end of the bias input circuit 430 to provide the bias V2. The control end P1 receives a selection control signal Sc. When the selection control signal Sc is at a first voltage level (e.g., a high voltage level), the selection circuit 550 couples the first input end IN1 to the first output end O1 and couples the second input end IN2 to the second output end O2. When the selection control signal Sc is at a second voltage level (e.g., a low voltage level), the selection circuit 550 couples the first input end IN1 to the second output end O2 and couples the second input end IN2 to the first output end O1. Accordingly, the bias V1 is determined to be the constant voltage Vbias or the voltage Vdet. When the bias V1 is the constant voltage Vbias, the bias V2 is the voltage Vdet. When the bias V1 is the voltage Vdet, the bias V2 is the constant voltage Vbias. Therefore, with the help of the selection circuit 550, it is more convenient to switch the constant voltage Vbias and the voltage Vdet.

In an embodiment of the present invention, the selection circuit of the predistorters 300 may has a first input end, a second input, an output end, and a control end. The first input end receives the constant voltage Vbias, the second input end receives the voltage Vdet, the output end is coupled to an input end of the bias input circuit 320 to provide the bias V1, and the control end receives the selection control signal Sc. When the selection control signal Sc is at a first voltage level (e.g., a high voltage level), the selection circuit couples the first input end to the output end; when the selection control signal Sc is at a second voltage level (e.g., a low voltage level), the selection circuit couples the second input end to the output end. In another embodiment of the present invention, the predistorters 300 may further comprise dynamic bias adjusting circuit 500 shown in FIG. 15.

Figure 21:
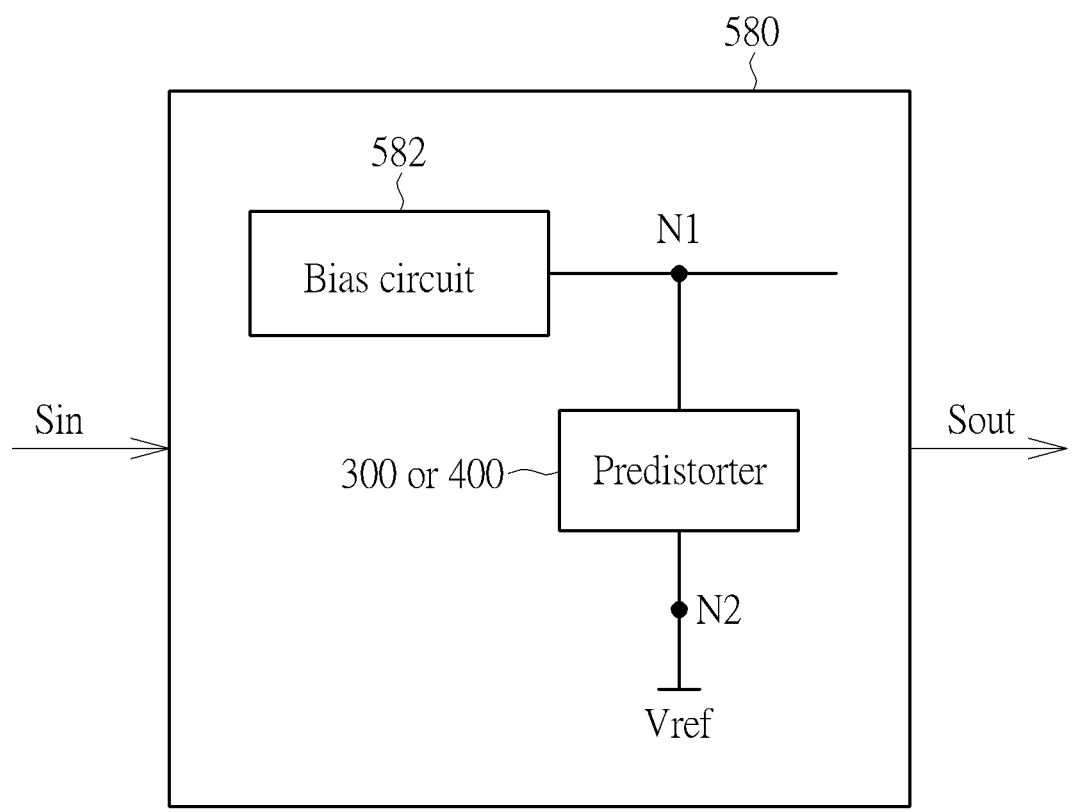
FIGS. 21, 22A and 22B are diagrams respectively illustrating the different positions of the predistorter in the amplifier according to different embodiments of the present invention.
Figure 22A:
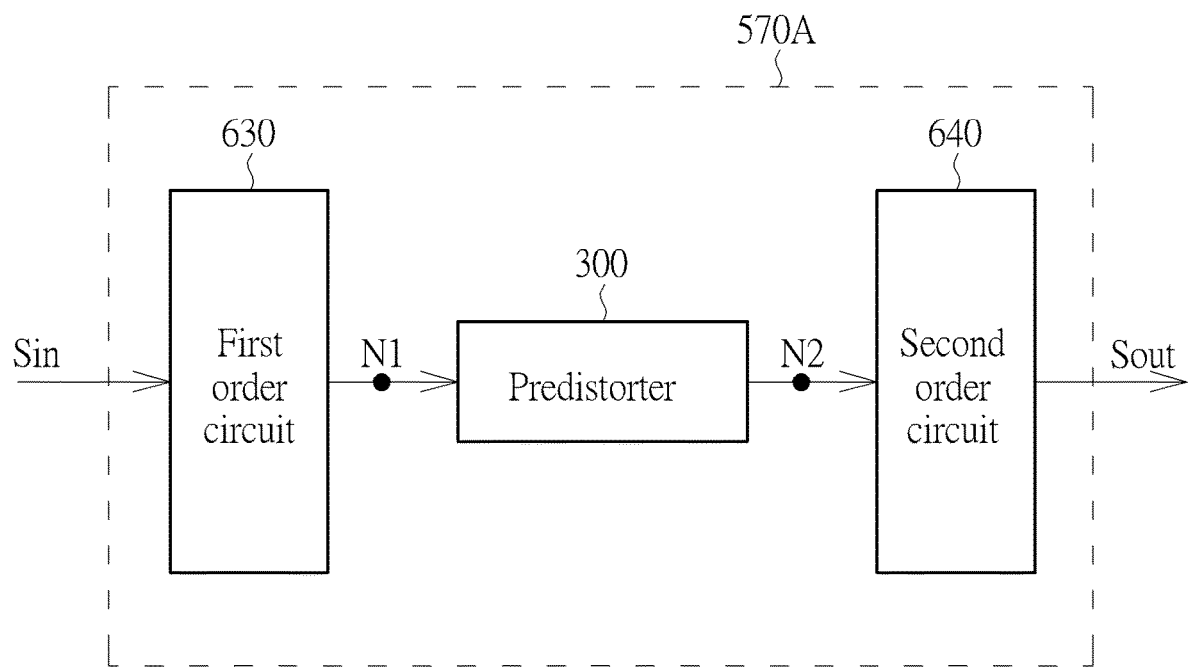
Figure 22B:
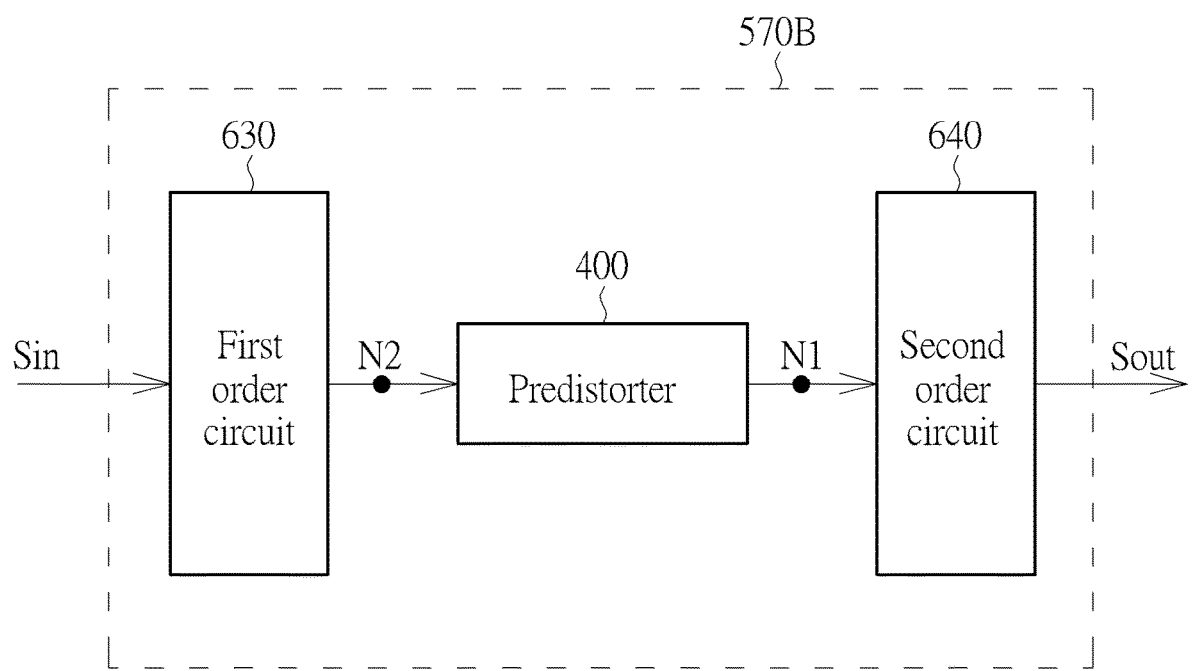

In the above embodiments, the predistorters 300 and 400 are provided between the nodes N1 and N2 of the amplifier, where the node N1 may be the input end of the amplifier and the node N2 may provide the reference voltage Vref, as shown in FIG. 5. However, the present invention is not limited thereto. Please refer to FIGS. 21, 22A and 22B. FIGS. 21, 22A and 22B are diagrams respectively illustrating the different positions of the predistorter 300 and 400 in the amplifier according to different embodiments of the present invention. In the embodiment of FIG. 21, the node N1 is one end of the bias circuit 582 of the amplifier 580, and the node N2 is coupled to the reference voltage Vref. In the embodiment of FIG. 22A, the node N1 is coupled to an output end of a first order circuit 630 of the amplifier 570A and the node N2 is coupled to an input end of a second order circuit 640 of the amplifier 570A. The first order circuit 630 and the second order circuit 640 are used to amplify the input signal Sin twice so as to output the output signal Sout. In the embodiment of FIG. 22B, the node N2 is coupled to an output end of a first order circuit 630 of the amplifier 570B and the node N1 is coupled to an input end of a second order circuit 640 of the amplifier 570B.

Figure 23:
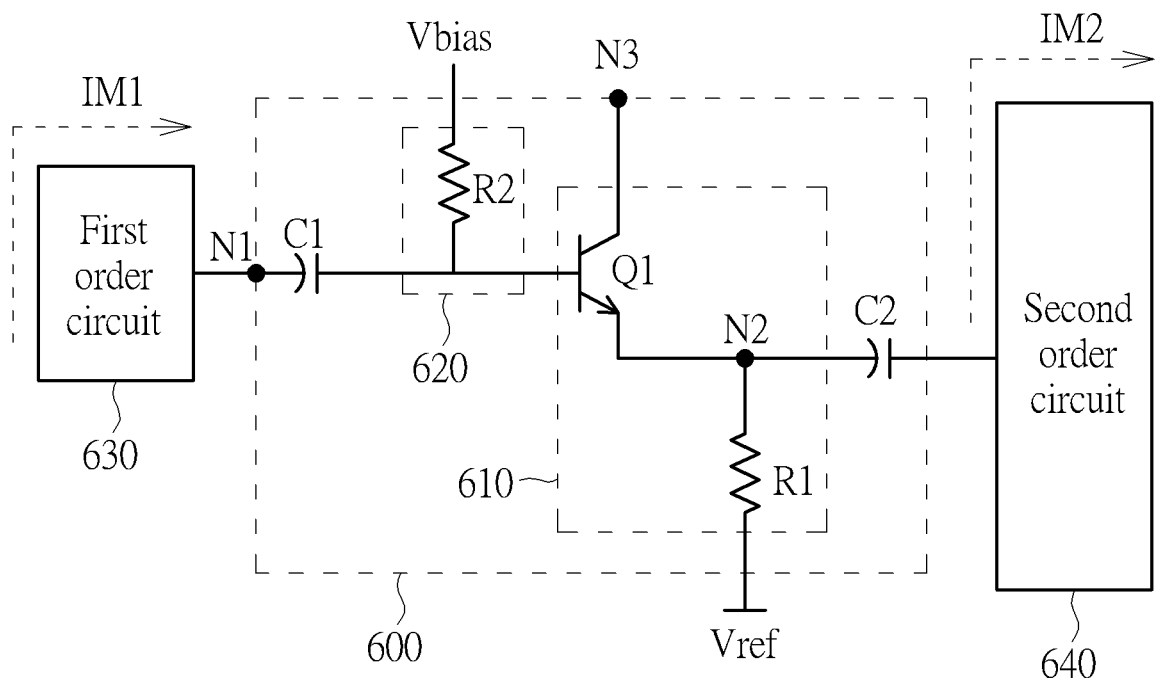
FIG. 23 is a circuit diagram of a predistorter according to an embodiment of the present invention.

Please refer to FIG. 23. FIG. 23 is a circuit diagram of a predistorter 600 according to an embodiment of the present invention. The predistorter 600 is coupled between the first order circuit 630 and the second order circuit 640 of the amplifier. The first order circuit 630 and the second order circuit 640 have impedances IM1 and IM2 respectively. The predistorter 600 comprises a bias input circuit 620, a capacitor C1, a capacitor C2, and an impedance conversion circuit 610. The bias input circuit 620 is used to input the constant voltage Vbias. The first end of the capacitor C1 is coupled to the output end of the first order circuit 630, and the second end of the capacitor C2 is coupled to the input end of the second order circuit 640. The impedance conversion circuit 610 is used to perform an impedance conversion so as to provide the variable capacitance, and may also provide a variable resistance R at the same time. The impedance conversion circuit 610 comprises a resistor R1 and a BJT Q1. A second end of the resistor R1 is coupled to the reference voltage Vref. The base of the BJT Q1 is coupled to the output end of the first bias input circuit 620 and a second end of the capacitor C1. The collector of the BJT Q1 is floating. The emitter of the BJT Q1 is coupled to a first end of the resistor R1 and a first end of the capacitor C2. In the present embodiment, the constant voltage Vbias is a fixed positive voltage. Since the collector of the BJT Q1 is floating, the BJT Q1 can be regarded as a forward biased diode having the clipping function. The compensation for the linear of the predistorter 600 is similar to the compensation for the linear of the predistorter 300 and could also be used to adjust the interstage matching impedance so as to achieve better linearity.

Figure 24:
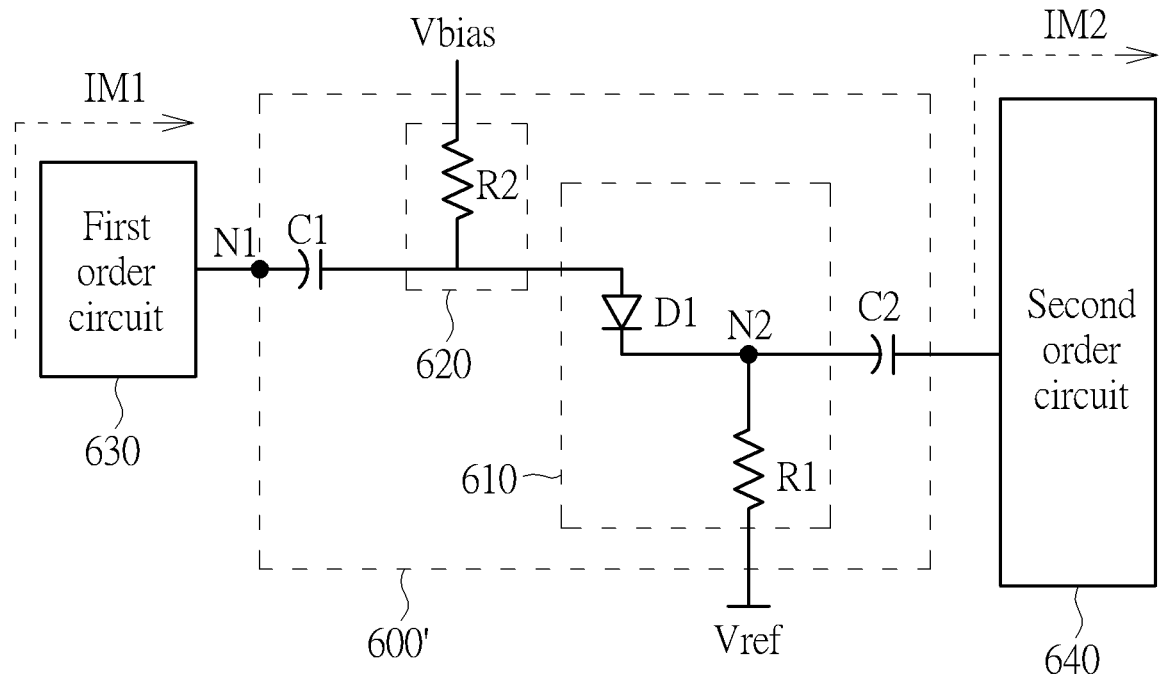
FIG. 24 is a circuit diagram of a predistorter according to another embodiment of the present invention.

In another embodiment, a diode may be used to replace the BJT Q1 in FIG. 23. Please refer to FIG. 24. FIG. 24 is a circuit diagram of a predistorter 600' according to another embodiment of the present invention. The difference between the predistorters 600' and 600 is that the transistor Q1 of the predistorter 600 is replaced by the diode D1. The anode of the diode D1 is substantially equal to the base of the transistor Q1, and the cathode of the diode is substantially equal to the emitter of the transistor Q1. As compared with the transistor Q1 in FIG. 23, the diode D1 in FIG. 24 may occupy a larger layout area.

Figure 25:
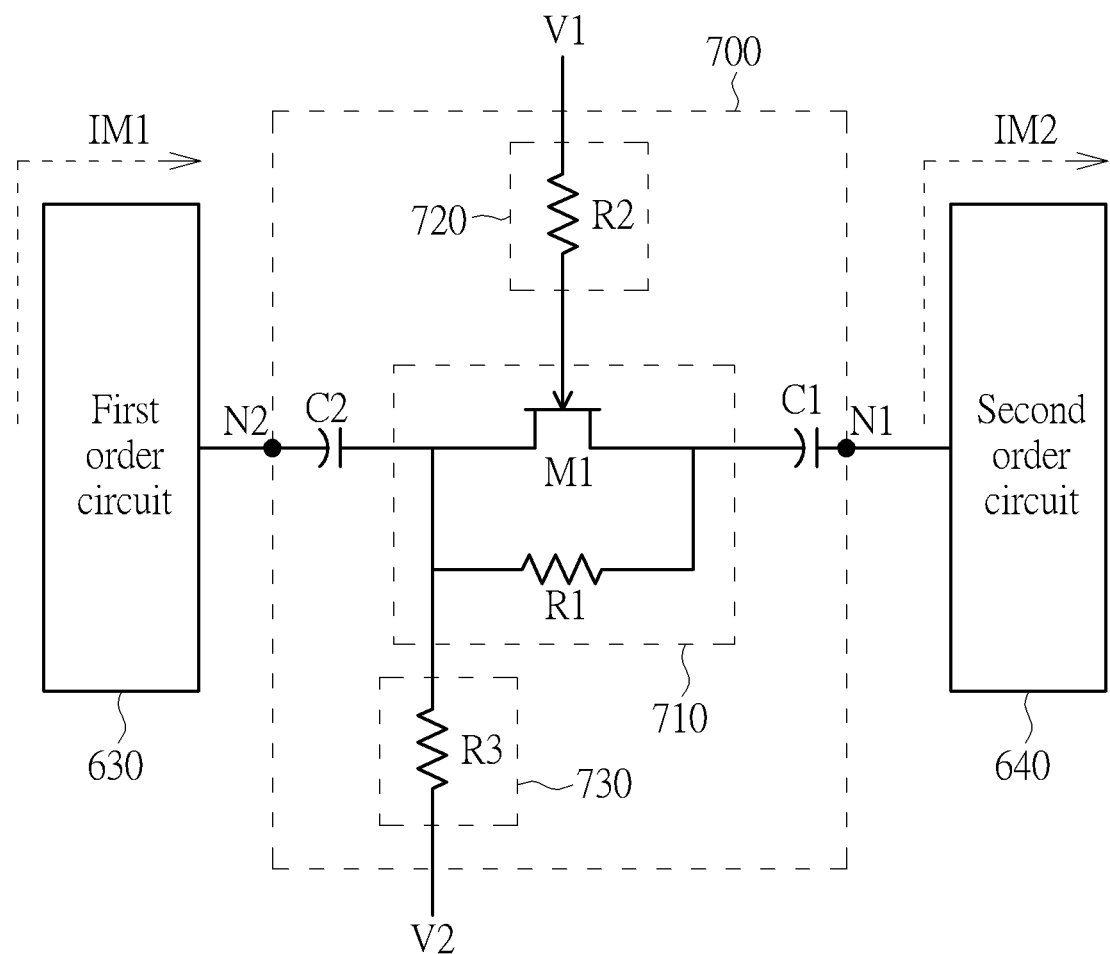
FIG. 25 is a circuit diagram of a predistorter according to an embodiment of the present invention.

Please refer to FIG. 25. FIG. 25 is a circuit diagram of a predistorter 700 according to an embodiment of the present invention. The predistorter 700 is coupled between the first order circuit 630 and the second order circuit 640 of the amplifier. The first order circuit 630 and the second order circuit 640 have impedances IM1 and IM2 respectively. The predistorter 700 comprises a bias input circuit 720, a bias input circuit 730, a capacitor C1, a capacitor C2, and an impedance conversion circuit 710. The bias input circuit 720 receives the bias V1, and the bias input circuit 730 receives the bias V2. The biases V1 and V2 may be the constant voltage Vbias and the voltage Vdet. In detail, when the bias V1 is the constant voltage Vbias, the bias V2 is the voltage Vdet. When the bias V1 is the voltage Vdet, the bias V2 is the constant voltage Vbias. The second end of the capacitor C2 is coupled to the output end of the first order circuit 630 via the node N2, and the first end of the capacitor C1 is coupled to the input end of the second order circuit 640 via the node N1. The impedance conversion circuit 710 is used to perform an impedance conversion so as to provide a variable capacitance, and may also provide a variable resistance R at the same time. The impedance conversion circuit 710 comprises a resistor R1 and an FET M1. The gate of the FET M1 is coupled to the output end of the bias input circuit 720. One of the source and the drain of the FET M2 is coupled to the output end of the bias input circuit 730, a first end of the capacitor C2 and a second end of the resistor R1. Another of the source and the drain of the FET M2 is coupled to a second end of the capacitor C1 and a first end of the resistor R1. The compensation for the linear of the predistorter 700 is similar to the compensation for the linear of the predistorter 400. When the bias V1 is the constant voltage Vbias and the bias V2 is the voltage Vdet (or when the bias V1 is the voltage Vdet and the bias V2 is a constant voltage Vbias), the predistorter 700 is suitable for reducing the amplitude distortion of the amplifier and improving the linearity of the amplifier.

Figure 26:
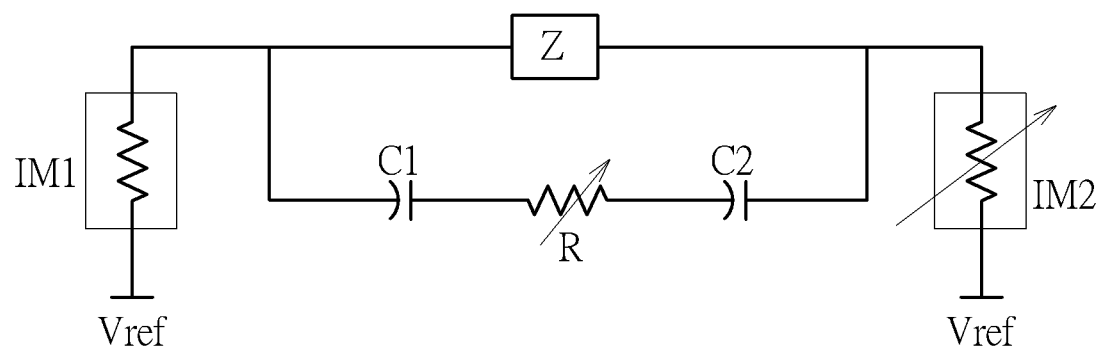
FIG. 26 is an equivalent circuit diagram of the predistorter shown in FIG. 23, FIG. 24, or FIG. 25.

Please refer to FIG. 26. FIG. 26 is an equivalent circuit diagram of the predistorter 600, 600' or 700 shown in FIG. 23, FIG. 24, or FIG. 25. Taking the predistorter 600 in FIG. 23 for example, the first order circuit 630 and the second order circuit 640 have the resistances IM1 and IM2 respectively. The predistorter 600 is coupled between the first order circuit 630 and the second order circuit 640 of the amplifier and comprises a bias input circuit 620, a capacitor C1, a capacitor C2, and an impedance conversion circuit 610. The impedance conversion circuit 610 is used to perform an impedance conversion so as to provide a variable resistance R. An impedance Z is the interstage matching impedance and could be represented by inductance or capacitance. Similarly, the equivalent circuit diagrams of the predistorters 600' and 700 in FIGS. 24 and 25 could be also represented by the equivalent circuit diagram shown in FIG. 26.

The predistorters according to the embodiments of the present invention can compensate the linearity of the amplifiers. The predistorter has an impedance conversion circuit for performing an impedance conversion to provide a variable capacitance, and problems of the amplifiers having a large volume, a low gain and/or a narrow bandwidth could be reduced or avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A predistorter for compensating linearity of an amplifier, the predistorter comprising:
   a first capacitor having a first end coupled to a first node of the amplifier;
   a first bias input circuit configured to receive a first bias;
   a second bias input circuit configured to receive a second bias;
   a second capacitor; and an impedance conversion circuit configured to perform an impedance conversion to provide a variable capacitance, the impedance conversion circuit comprising:
a first resistor; and
a field-effect transistor (FET);
wherein a gate of the FET is coupled to an output end of the first bias input circuit, one of a source and a drain of the FET is coupled to a second end of the first capacitor and a first end of the first resistor, another of the source and the drain of the FET is coupled to an output end of the second bias input circuit, a first end of the second capacitor and a second end of the first resistor, and a second end of the second capacitor is coupled to a second node of the amplifier.

2. The predistorter of claim 1, wherein the first node is an input end of the amplifier, and the second node is coupled to a reference voltage.

3. The predistorter of claim 1, wherein the first node is an end of a bias circuit of the amplifier, and the second node is coupled to a reference voltage.

4. The predistorter of claim 1, wherein the first node is coupled to an output end of a first order circuit of the amplifier, and the second node is coupled to an input end of a second order circuit of the amplifier.

5. The predistorter of claim 1, wherein one of the first bias and the second bias is a constant voltage, and another of the first bias and the second bias is varied with an input power of the amplifier.

6. The predistorter of claim 1 further comprising a selection circuit configured to select the first bias from a first voltage and a second voltage, wherein the first voltage is a constant voltage, and the second voltage is varied with an input power of the amplifier.

7. The predistorter of claim 6, wherein the selection circuit comprises:
a first input end configured to receive the first voltage;
a second input end configured to receive the second voltage; and
a first output end, coupled to an input end of the first bias input circuit to provide the first bias;
a second output end, coupled to an input end of the second bias input circuit to provide the second bias; and
a control end configured to receive a selection control signal;
wherein when the selection control signal is at a first voltage level, the selection circuit couples the first input end to the first output end and couples the second input end to the second output end; and
wherein when the selection control signal is at a second voltage level, the selection circuit couples the first input end to the second output end and couples the second input end to the first output end.

8. The predistorter of claim 6 further comprising a dynamic bias adjusting circuit coupled to an input end of the amplifier and configured to dynamically adjust the second voltage according to the input power of the amplifier.

9. The predistorter of claim 8, wherein the dynamic bias adjusting circuit comprises:
a first resistor-capacitor circuit having an input end coupled to the input end of the amplifier;
a transistor having a first end coupled to a system voltage, and a control end coupled to an output end of the first resistor-capacitor circuit;
a second resistor-capacitor circuit, coupled between a reference voltage and a second end of the transistor; and
an operational amplifier having a first input end coupled to the second end of the transistor, a second input end, and an output end coupled to the second end of the operational amplifier and configured to output the second voltage.

10. The predistorter of claim 1, wherein the first bias input circuit comprises a second resistor, and the second bias input circuit comprises a third resistor;
wherein a first end of the second resistor receives the first bias, and a second end of the second resistor is coupled to the output end of the first bias input circuit; and
wherein a first end of the third resistor receives the second bias, and a second end of the third resistor is coupled to the output end of the second bias input circuit.

* * * * *